US006620672B1

(12) United States Patent
Dennison et al.

(10) Patent No.: US 6,620,672 B1
(45) Date of Patent: Sep. 16, 2003

(54) SOI DRAM WITH BURIED CAPACITOR UNDER THE DIGIT LINES UTILIZING A SELF ALIGNING PENETRATING STORAGE NODE CONTACT FORMATION

(75) Inventors: Charles H. Dennison, Boise, ID (US); John K. Zahurak, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/140,328

(22) Filed: May 8, 2002

Related U.S. Application Data

(62) Division of application No. 09/614,117, filed on Jul. 11, 2000, now Pat. No. 6,429,069.

(51) Int. Cl.⁷ .......................................... H01L 21/8242
(52) U.S. Cl. .................. 438/239; 438/142; 438/147; 438/175; 438/244; 438/253
(58) Field of Search ................. 438/239, 253, 438/142, 147, 175, 244

(56) References Cited

U.S. PATENT DOCUMENTS

| | | | |
|---|---|---|---|
| 5,140,389 A | | 8/1992 | Kimura et al. |
| 5,225,363 A | | 7/1993 | Riemenschneider et al. |
| 5,640,342 A | * | 6/1997 | Gonzalez .................... 365/156 |
| 5,897,351 A | * | 4/1999 | Forbes ........................ 438/242 |
| 6,037,194 A | * | 3/2000 | Bronner et al. ............. 438/147 |
| 6,235,573 B1 | * | 5/2001 | Lee et al. .................... 438/241 |
| 6,291,276 B1 | * | 9/2001 | Gonzalez .................... 438/159 |

OTHER PUBLICATIONS

Kim et al. "Advanced Integration Technology for a Highly Scalable SOI DRAM with SOC (Silicon–On–Capacitors)" IEDM 96–605, pp. 22.5.1–22.5.4 (1996).

S. Nakamura et al. "Giga–bit DRAM cells with low capacitance and low resistance bit–lines on buried MOSFET's and capacitors by using bonded SOI technology–Reversed–Stacked–Capacitor (RSTC) Cell", IEDM 95–889, pp. 35.4.1–35.4.4 (1995).

Nishihara et al. A Buried Capacitor DRAM Cell with Bonded SOI for 256M and 1 Gbit DRAMs, IEDM 92–803, pp. 32.2.1–32.2.4 (1992).

B.H. Lee et al. "A Novel Pattern Transfer Process for Bonded SOI Giga–bit DRAMs", Proceedings 1996 IEEE International SOI Conference, 96 CH 35937, Oct. 1996.

* cited by examiner

*Primary Examiner*—Son T. Dinh
*Assistant Examiner*—Pho M. Luu
(74) *Attorney, Agent, or Firm*—Dickstein Shapiro Morin & Oshinsky LLP

(57) ABSTRACT

A method of fabricating a memory cell is described in which an access transistor is first formed on an SOI substrate. The access transistor contains source and drain regions in a semiconductor material layer of the substrate and at least one gate stack which includes a gate region electrically connected with a word line. At least one capacitor is formed con a first side of the substrate and is electrically connected to one of the source and drain regions. At least one bit line conductor is formed on the reverse or flip side of the substrate, wherein the bit line conductor is electrically connected to the other of the source and drain regions. Self-aligned contact openings are formed through insulative material over the substrate to provide vias for the electrical connections for each of the capacitor and bit line conductor. These contact openings and the deposited contact material are substantially preserved throughout the entire fabrication process.

46 Claims, 9 Drawing Sheets

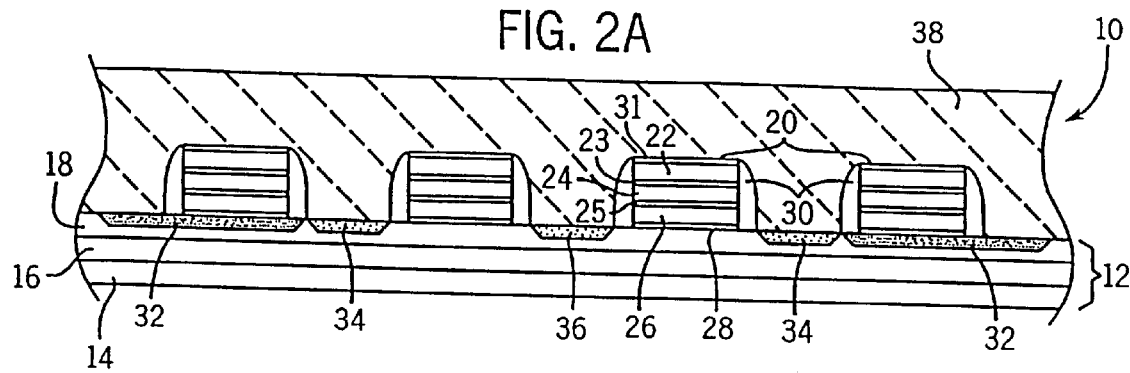
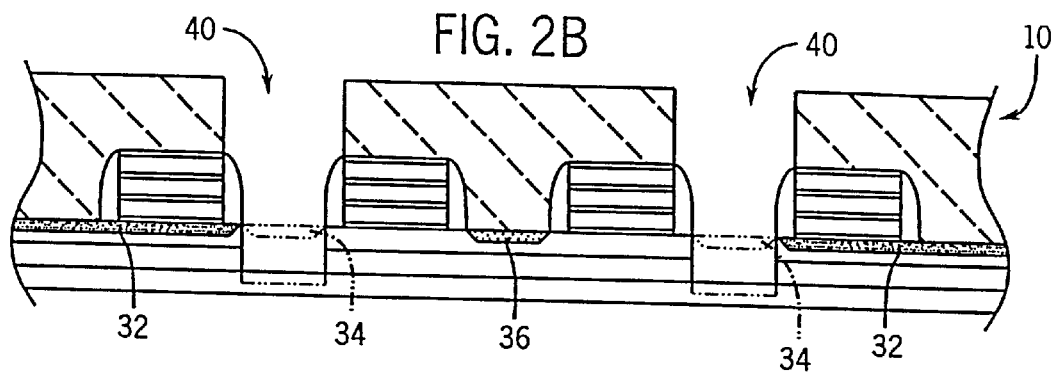
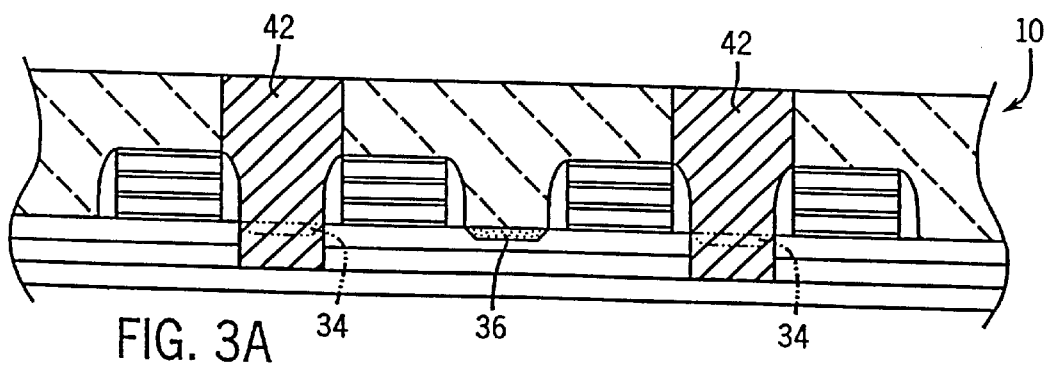
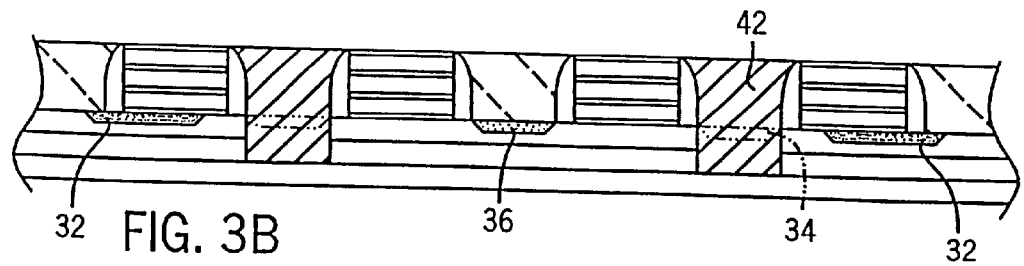

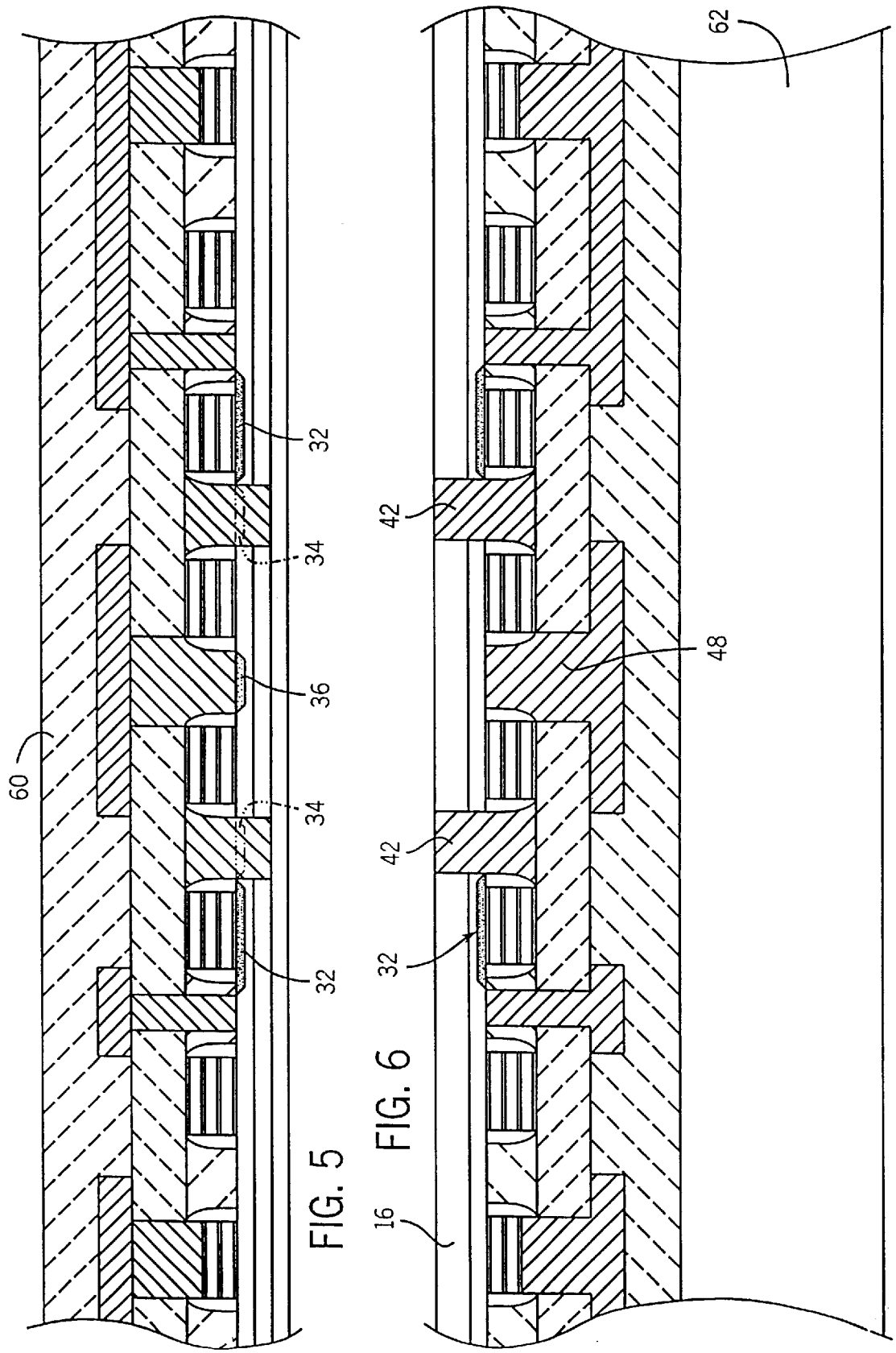

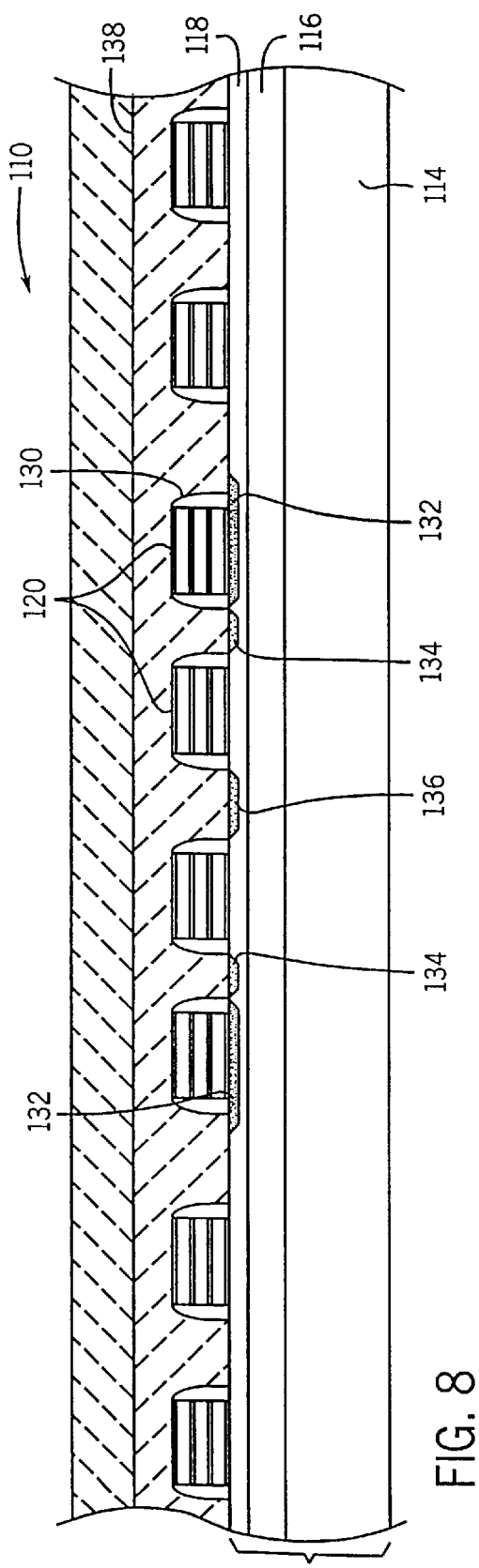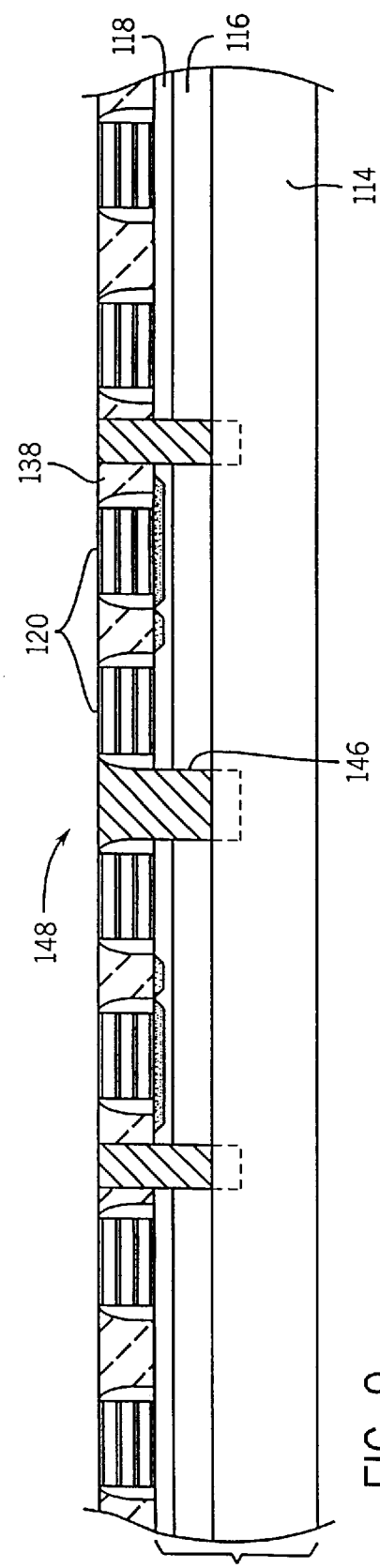

SOI DRAM WITH BURIED CAPACITOR UNDER THE DIGIT LINES UTILIZING A SELF ALIGNING PENETRATING STORAGE NODE CONTACT FORMATION

This application is a divisional of U.S. patent application Ser. No. 09/614,117, entitled "SOI DRAM WITH BURIED CAPACITOR UNDER THE DIGIT LINES UTILIZING A SELF ALIGNING PENETRATING STORAGE NODE CONTACT FORMATION" filed Jul. 11, 2000. The entirety of this application is hereby incorporated by reference.

FIELD OF THE INVENTION

The present invention relates to methods of forming a semiconductor DRAM device with a buried capacitor. More specifically, the invention is directed to processes for fabricating a capacitor and a bit line conductor on opposite sides of a silicon-on-insulator substrate containing access transistors in which a self-aligned contact is preserved throughout the entire fabrication process. The invention also relates to the structures formed according to the processes hereinafter set forth.

BACKGROUND OF THE INVENTION

In today's semiconductor industry, the trend is increasingly towards denser arrays of components in a more compact area. However, as shown in FIGS. 1A and 1B, as capacitors 1 are brought closer together, the decrease in space between them necessitates that they be taller in order to provide the same capacitance value. Unfortunately, this means that a much deeper and narrower contact, e.g., a higher aspect ratio opening must in turn be provided for the digit or bit line plug 2 which must reach the transistor drain or source region in the substrate. The taller and more narrow the contact opening the harder it becomes to adequately "metallize" the contact with the plug and other conductive material.

A few attempts to solve this problem have involved the formation of capacitors and bit lines on opposite sides of a supporting substrate. For example, S. Nakamura et al. in their article "Giga-bit DRAM cells with low capacitance and low resistance bit-lines on buried MOSFET's and capacitors by using bonded SOI technology-Reversed-Stacked-Capacitor (RSTC) Cell", IEDM 95-889, pp.35.4.1–35.4.4 (1995) describe a process of fabrication in which the capacitor is first formed on a substrate and then buried in insulative material. Thereafter, a supporting substrate is bonded to the insulative material, and the entire wafer is then "flipped" or turned over. SOI (silicon-on-insulator) formation followed by bit line formation completes the wafer fabrication process.

Other attempts at capacitor structure have been proposed by Nishihara et al. in "A Buried Capacitor DRAM Cell with Bonded SOI for 256 M and 1 Gbit DRAMs", IEDM 92-803, pp. 32.3.1–32.2.4 (1992); B. H. Lee et al. "A Novel Pattern Transfer Process for Bonded SOI Giga-bit DRAMs", Proceedings 1996 IEEE International SOI Conference, 96 CH 35937, October 1996; and Kim et al. "Advanced Integration Technology for a Highly Scalable SOI DRAM with SOC (Silicon-On-Capacitors)" IEDM 96-605, pp. 22.5.1–22.5.4 (1996). In the latter Kim et al. article, fabrication proceeds by capacitor formation, wafer bonding, SOI formation, and then transistor and bit line formation.

All the foregoing methods, however, in addition to other problems also suffer from the fact that the digit or bit line contact formed after the wafer is "flipped" and then planarized is no longer self-aligned to the word line. This results in a significantly larger cell size for a given photolith capability. In other words, in the methods currently known in the art where the storage capacitor is formed on one side of the device, and then the device is "flipped" over and the digit contact is formed on the other side (or where the digit contact is formed first, and then the storage contact), only one of these contacts can be formed with a self-aligned contact (SAC) etch such that it is spaced away from the word line or gate electrode by the width of the spacer material. The other contact (on the opposite side to the word line or gate electrode) is thus not defined by the width between spacers, nor set exactly a spacer width away from the word line.

What is therefore needed in the art are more suitable methods of semiconductor wafer fabrication to provide more compact arrays of memory cells. More specifically, what is needed is a process of forming capacitors in which the starting substrate is first SOI processed and the self-aligned contact is preserved relative to the digit or bit line on both sides of the wafer throughout the entire fabrication process. Also needed are new structures afforded by these processes.

SUMMARY OF THE INVENTION

The method provides a method of fabricating a memory cell in which an access transistor is first formed on an SOI substrate. The access transistor is formed with source and drain regions in a semiconductor material layer of the substrate and has at least one gate stack which includes a gate region electrically connected with a word line. Also formed on a first side of the substrate is at least one capacitor which is electrically connected to one of the source and drain regions. At least one bit line conductor is formed on a second side of the substrate, which is opposite the first side. The bit line conductor is electrically connected to the other of the source and drain regions. At least one self-aligned contact plug connects at least one of the capacitor or the bit line conductor to the respective source or drain region.

Further provided as part of the invention is a method of fabricating a memory cell which comprises forming at least one transistor on a semiconductor substrate, such that the transistor has a source and drain region and at least one gate stack. Also formed is at least one capacitor connection plug which extends into the substrate and which is electrically coupled to one of the source and drain regions.

Further formed on the substrate is at least one bit line contact plug which is electrically connected to the other of the source and drain regions. In addition, a wiring connect is formed in contact with the bit line contact plug. A capacitor is then formed on an opposite side of the substrate to the side on which the bit line contact plug and wiring connect has been formed, such that the capacitor is electrically connected to the capacitor connection plug. At least one of the capacitor connection plug and the bit line contact plug is a self-aligned contact plug.

In a further embodiment there is provided a method of fabricating a memory cell, in which at least one transistor is first formed on a semiconductor substrate to have source and drain regions and at least one gate stack. At least one bit line contact plug is then formed into the substrate and is electrically connected to one of the source and drain regions. Also formed on the substrate is at least one capacitor connection plug which is electrically connected to the other of the source and drain regions. A capacitor is then formed over the capacitor connection plug and is electrically connected thereto. A wiring connect is then formed to the bit line contact plug on an opposite side of the substrate to the side on which the capacitor is formed. At least one of the capacitor connection plug and the bit line contact plug is a self-aligned contact plug.

The methods of the invention hereinafter described contemplate self-aligned contact etching of at least one, and preferably both of the bit line and capacitor connection contacts or plugs. In a preferred embodiment of the invention, these contacts are preserved throughout the entire fabrication process and even more preferably, are separated from their respective gate stacks by only the width of a spacer film which overlays the sides of the gate stacks.

The invention also provides a semiconductor device which is suitable for use as a memory cell. The device comprises a substrate, and an access transistor which has been formed on the substrate. The access transistor contains source and drain regions in a semiconductor material layer of the substrate. The access transistor also includes at least one gate stack with a gate region electrically connected with a word line. In addition, there is at least one capacitor formed on a first side of the substrate which is electrically connected to one of the source and drain regions. The device also contains at least one bit line conductor which has been formed on a second side of the substrate, which is opposite said first side. The bit line conductor is electrically connected to the other of the source and drain regions via a bit line contact plug. A capacitor connection contact or plug connects the capacitor to one of the source and drain regions. The capacitor connection plug and/or the bit line contact plug are preferably self-aligned contacts which are contained in self-aligned contact openings between gate stacks on the substrate, and even more desirably are separated from their respective gate stacks by the width of a spacer film which covers at least part of the sides of the gate stacks.

Additional advantages and features of the present invention will become more readily apparent from the following detailed description and drawings which illustrate various embodiments of the invention.

BRIEF DESCRIPTION OF THE DRAWINGS

FIG. 2A is a cross sectional view of a semiconductor device in an intermediate stage of fabrication according to a first embodiment of the invention.

FIG. 2B is a cross sectional view of the device shown in FIG. 1C in a further stage of fabrication.

FIG. 3A is a cross sectional view of the device shown in FIG. 2 in a further stage of fabrication.

FIG. 3B is a cross sectional view of the device shown in FIG. 3A in a further stage of fabrication.

FIG. 5 is a cross sectional view of the device shown in FIG. 4C in a further stage of fabrication.

FIG. 6 is a cross sectional view of the device shown in FIG. 5 which has been turned 180 degrees about the latitudinal axis.

FIG. 8 is a cross sectional view of a semiconductor device in an intermediate stage of fabrication according to a further embodiment of the invention.

FIG. 9 is a cross sectional view of the device shown in FIG. 8 in a further stage of fabrication.

DETAILED DESCRIPTION OF THE PREFERRED EMBODIMENTS

Figure 1A:
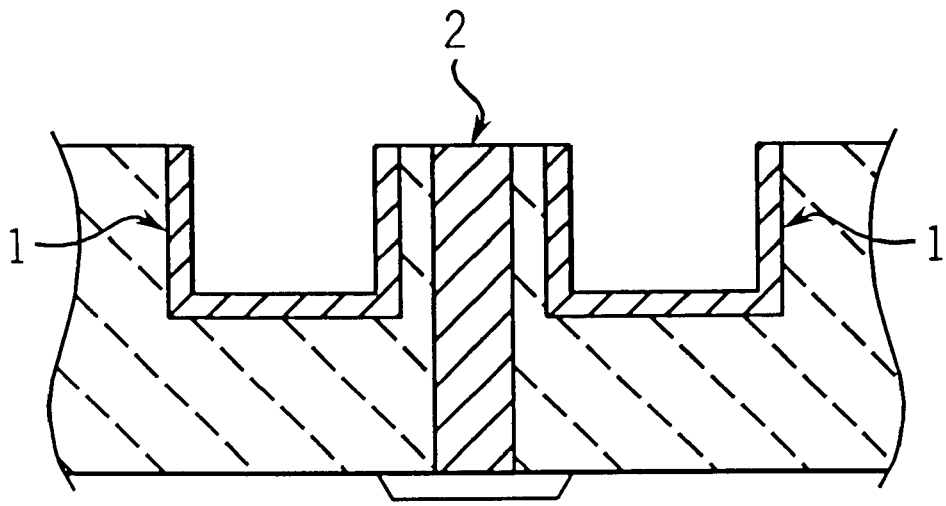
FIG. 1A is a cross sectional view of a semiconductor device in which the digit or bit line is located between the capacitors.
Figure 1B:
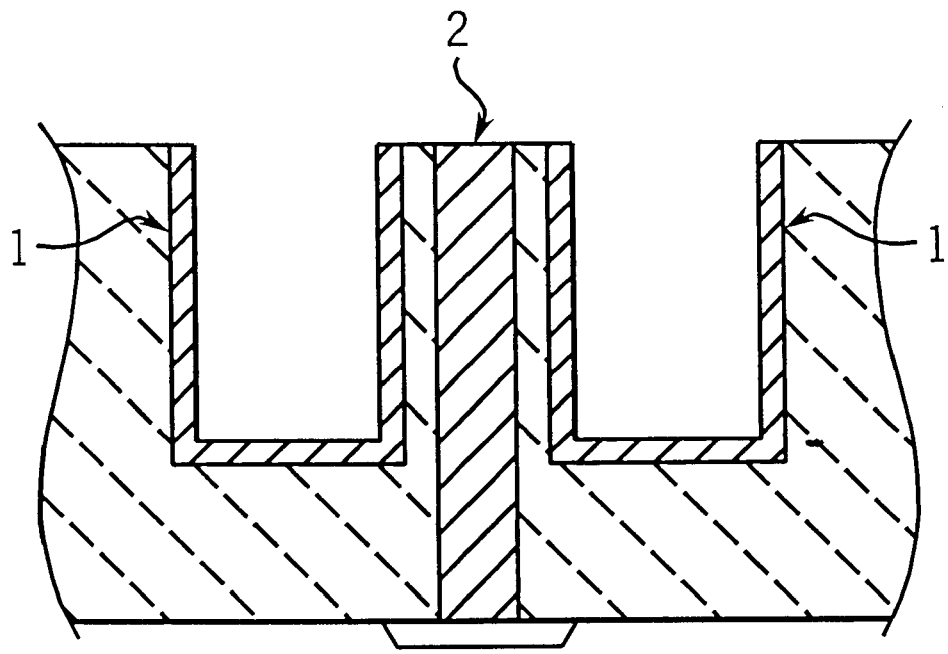
FIG. 1B is a cross sectional view of the semiconductor device shown in FIG. 1A in which the capacitors are brought closer together, thereby necessitating a larger, narrower contact for the bit line.

The invention in its broadest embodiment is directed to a method of fabricating a memory cell for use in a semiconductor device in which a transistor array is first formed on a substrate. Thereafter, at least one capacitor is formed on one side of the substrate. A bit line conductor is then formed on the opposite side of the substrate. Alternatively, the bit line conductor may be formed first, while the capacitor is formed thereafter. The capacitor is electrically connected to one of a source and drain region, while the bit line is electrically connected to the other of the source and drain region.

Reference herein shall be made to the terms "substrate" and "wafer", which are to be understood as including a silicon-on-insulator (SOI) or silicon-on-sapphire (SOS) structures, doped and undoped semiconductors, epitaxial layers of silicon supported by a base semiconductor foundation, and other semiconductor structures. In addition, when reference is made to a "substrate" or "wafer" in the following description, previous process steps may have been utilized to form arrays, regions or junctions in or on the base semiconductor structure or foundation. In addition, the semiconductor need not be silicon-based, but could be based on silicon-germanium, germanium, indium phosphide, or gallium arsenide. The term "substrate" as used herein may also refer to any type of generic base or foundation structure.

Referring again to the drawings in which like numerals indicate like components throughout the various embodiments, FIG. 2A shows a semiconductor device 10 in an intermediate stage of fabrication. According to the method of the invention, the device 10 is first fabricated with a basic silicon-on-insulator (SOI) structure using materials and methods known in the art. Shown is a silicon-on-insulator (SOI) substrate 12 having first and second silicon layers 14, 18 and an insulator region 16 between the silicon layers. The insulator region 16 may also be referred to as a "box" layer and may be formed of suitable insulating material such as silicon dioxide ($SiO_2$), for example.

After SOI formation, transistor gate stacks 20 are formed in an array on the substrate 12 using successive Chemical Vapor Deposition (CVD), Low Pressure Chemical Vapor Deposition (LPCVD), sputtering and other known processes, followed by conventional photolithography and etching techniques. Each gate stack 20 is comprised, for example, of a cap layer 22, e.g. nitride-containing or oxide-containing material, which is formed over a thin sandwich oxide layer 23. The sandwich oxide layer 23 is in turn formed over a conductive layer 24 which may be comprised of tungsten, tungsten silicide, or cobalt silicide. The conductive layer 24 may be formed atop an optional polycrystalline silicon (polysilicon) layer 26. The polysilicon layer 26 may optionally be doped with boron, arsenic or germanium. In certain embodiments it may be desirable to include a diffusion barrier layer 25 between the conductive layer 24 and the polysilicon layer 26. The diffusion barrier layer 25 will inhibit diffusion of atoms from the conductive layer 24, and may be formed of titanium nitride, tantalum nitride and titanium tungsten, for example. Between the polysilicon layer 26 and the silicon layer 18 of the substrate 12 is a thin gate oxide layer 28. All the foregoing layers making up the gate stack 20 can vary in thickness from a few Angstroms to a few thousand Angstroms.

A spacer film 30 protects the sides of the gate stack 20. The spacer film 30 is typically formed of a nitride containing material such as silicon nitride ($Si_3N_4$) or alternatively an oxide-containing material. The spacer film 30 typically first overlays the entire substrate 12, and is subsequently etched back and planarized with the top of the gate stack 20. The spacer film material isolates the gate stack 20 from the materials which are used in self-aligned contact etching, as hereinafter described. The spacer film 30 is typically on the order of about a few Angstroms to about a few hundred Angstroms thick. In addition to the foregoing spacer film 30, a thin protective insulating layer 31 may be formed on the tops of the gate stacks 20, and optionally over the substrate 12 as well. This protective layer 31 is comprised of suitable materials known in the art, and may be formed, for example, of tetraethylorthosilicate (TEOS).

Field oxide regions 32 are formed in the silicon region 18 to isolate the adjacent memory cells. Also implanted in the silicon region 18 of the substrate 12 are source regions 34 and a drain region 36. This configuration is for purposes of illustration only, and it is understood by the skilled artisan that alternatively, region 34 could function as the drain region, while region 36 could function as the source region. The source and drain regions may be formed by ion implantation of N+ and P+ impurities, for example, using arsenic, phosphorus, boron ions. Both the source and drain regions and the field oxide regions may be formed before or after the gate stacks described above. The gate stack 20 together with the source and drain regions 34, 36 are often referred to in the art as an access transistor in which the gate thereof forms a "word line."

In a more preferred embodiment of the invention, the source and drain regions 34, 36 shown in FIG. 2A are not heavily doped, i.e. are not N+ or P+ implanted. Instead, all N+ and P+ dopings are eliminated and N+/P+ diffusion is obtained from an N+ and/or P+ doped polysilicon contact plug, as hereinafter described, and thus the invention may be said to rely on LDD, or low density diffusion. In this embodiment, it will be understood by the skilled artisan that the source, drain regions 34, 36 may also be referred to individually or collectively as the undoped regions 34, 36.

As further shown in FIG. 2A, an insulative layer 38 is then deposited over to the gate stacks 20 and surrounding components using methods known in the art. The insulative layer 38 is typically formed of a material such as Boro-Phospho-Silicate Glass (BPSG), which is silicon dioxide that contains boron and phosphorus atoms. The substrate formed as shown in FIG. 2A is utilized as a base structure in the formation of various embodiments of the invention.

According to a first embodiment of the invention shown in FIG. 2B, contact openings or vias 40 are then formed in the first insulative layer 38 using self-aligned contact etching (SAC) techniques, for example, using dry etching techniques.

The self-aligned contact opening 40 uses the sides of the gate stacks 20 (protected by the spacer film 30) as a guide down to and through the substrate 12. The contact opening 40 extends into the substrate 12 through the source (undoped) regions 34, and through the silicon layer 18, the box oxide layers 16 and stops on the silicon layer 14. The contact opening 40 may also optionally extend into the silicon layer 14 as shown by the dotted lines in FIG. 2. After the contact opening 40 is formed, the sides and bottom thereof may optionally be cleaned of any etch residue using methods known in the art, for example, using an oxygen ($O_2$) plasma strip step. A follow-up metallization, for example, using a titanium-containing compound to coat the sides and/or the bottom of the contact opening 40 may be effected after the cleaning step.

Referring now to FIG. 3A, at least one conductive plug 42 is then deposited in the contact opening 40. FIG. 3A shows two conductive plugs 42 in the respective contact openings 40. The conductive plug is typically formed of a conductive metallic material, or more preferably may be polysilicon material which has been infused or doped with additional material such as metallic ions or other compounds, e.g. N+, and/or P+ using arsenic, boron or phosphorous. The conductive plug 42 may also be referred to as a capacitor connection plug, since it-will ultimately electrically connect a capacitor, hereinafter described, with the source region 34. After deposition of the plug 42 is complete, the top of the wafer, including the top portion of the first insulative layer 38 and the corresponding top portion of the plug 42, may be etched back or planarized using chemical mechanical planarizing (CMP) techniques to be substantially coplanar with the top of the gate stack 20 as shown in FIG. 3B.

Figure 4A:
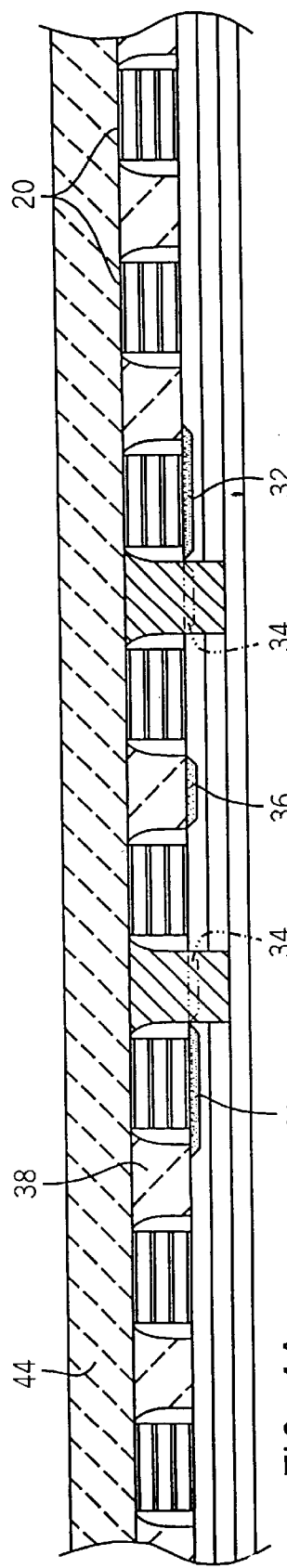
FIG. 4A is a cross sectional view of the device shown in FIG. 3B in a further stage of fabrication.

Referring now to FIG. 4A, there is shown an expanded view of the semiconductor device shown in FIG. 3B with additional gate stacks 20 and a second insulative layer 44, e.g. BPSG, which is then formed over the first insulative layer 38, the gate stacks 20 and the capacitor connection plugs 42. Using SAC etching techniques as heretofore described, a bit line contact opening 46 is formed in the second insulative layer 44. The bit line contact opening 46 extends between the gate stacks 20 where shown in FIG. 3B and penetrates through the second and first insulative layers 44, 38 and stops on the surface of the silicon layer 18 above the drain (undoped) region 36. A material such as titanium may be used to coat the inside surfaces of the contact opening 46 after an optional cleaning step. This titanium material improves the adhesion of a subsequently deposited plug within the second insulative layer 44. The titanium material will also form two conductive material layers, Ti-silicide at the bottom of the contact opening and Ti-nitride on the sides of the contact opening. These titanium-containing materials also help protect the silicon substrate 18 from being damaged during the subsequent plug deposition.

Figure 4B:
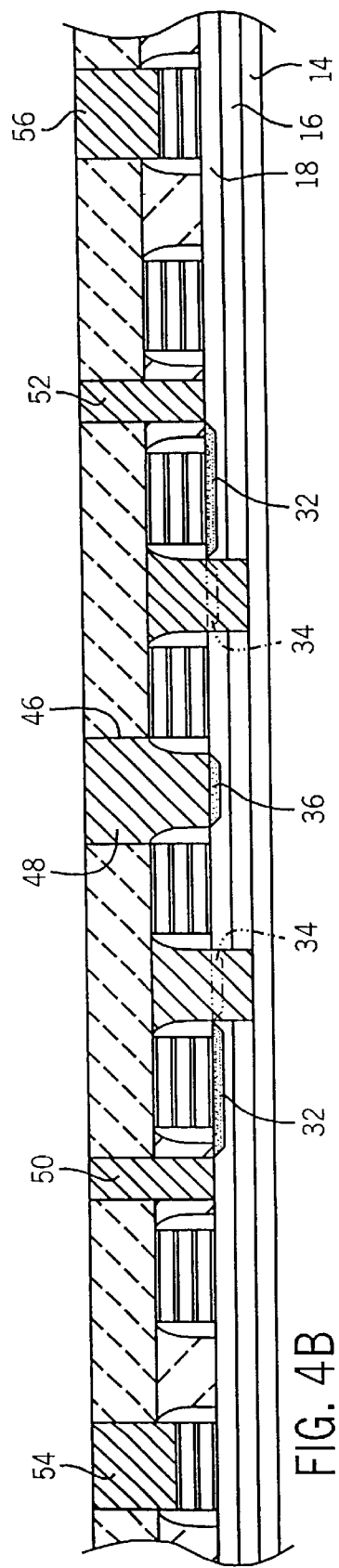
FIG. 4B is a cross sectional view of the device shown in FIG. 4A in a further stage of fabrication.

As further shown in FIG. 4B, a bit line contact plug 48 is deposited in the contact opening 46 using deposition techniques known in the art. For example, tungsten hexafluoride ($WF_6$) and silane ($SiH_4$) are reacted together in a reaction chamber, followed by introduction of hydrogen gas ($H_2$) to replace the depleted silane. The bit line contact plug 48 contacts the drain region 36. Because the capacitors, hereinafter described, will be formed on the opposite side of the substrate 12, the height of the bit line contact opening 46 and plug 48 is unaffected by the height of the capacitors. In other words, the depth of both the contact opening 46 and subsequently deposited plug 48 will be capacitor height-independent and thus do not have to be as tall as the capacitors. Moreover, the self-aligned contact openings 40 and 46 and plugs 42 and 48 will be preserved, i.e. not affected or destroyed, during the subsequent capacitor formation.

Also shown in FIG. 4B are additional peripheral plugs 50, 52, 54 and 56 comprised of substantially the same or similar material as the tungsten-containing bit line contact plug 48. Plugs 50 and 52 extend through the second and first insulative layers 44, 38 and stop on the surface of the silicon layer 18 of the substrate 12. Plugs 54 and 56 extend into their respective gate stacks 20 and through the conductive cap layer 22 and stop at the polysilicide layer 24 as shown in FIG. 4B. (The insulating cap layer 31 has been removed during a previous photo and etch step, not shown.)

Figure 4C:
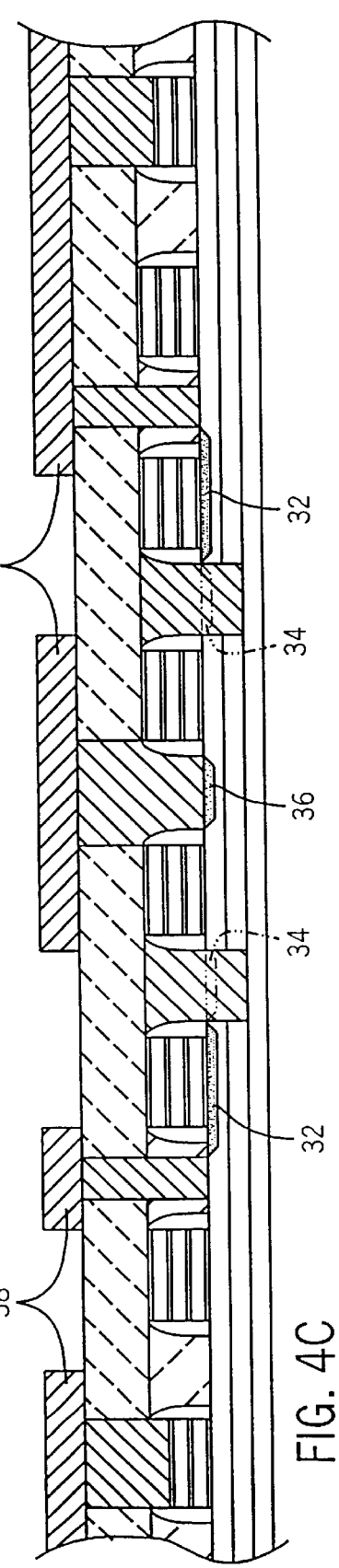
FIG. 4C is a cross sectional view of the device shown in FIG. 4B in a further stage of fabrication.

Referring now to FIG. 4C, a wiring connect or bit line conductor 58 is when formed atop the bit line contact plug 48 and the respective plugs 50, 52, 54 and 56. Each wiring connect 58 may be integrally formed with their respective plugs by extending tungsten deposition during formation of the plugs to cover the second insulative layer 44 and then patterning of the wiring connect 58 can be performed. Alternatively, the tops of the respective plugs 50, 52, 54 and 56 together with a corresponding depth of the second insulative layer 44 may be etched back or planarized using CMP techniques as heretofore described. Thereafter, the wiring connects or bit line conductors 50 can be subsequently formed atop the respective plugs using substantially the same or similar material and methods as was utilized to form the plugs, e.g. tungsten-containing material.

Referring now to FIG. 5, a third insulative layer 60, e.g. BPSG, is formed atop the second insulative layer 44 using materials and methods as heretofore described. The third insulative layer 60 overlays the entire semiconductor array and in effect "buries" the electrical connections.

Referring now to FIG. 6, the entire semiconductor device 10 is subsequently turned over or "flipped", preferably approximately 180 degrees about the latitudinal axis of the substrate 12. Just prior to flipping, or thereafter, a handler layer 62 is affixed or bonded to the third insulative layer 60 using known semiconductor wafer bonding techniques. As further shown in FIG. 6, the now inverted silicon layer 14 is then removed by etching or CMP methods as heretofore described as well as by cleaving. This step planarizes the now-inverted capacitor connection plugs 42 with the top of the now-inverted box oxide layer 16, and thereby exposes at least the top portion of the capacitor connection plugs 42.

Figure 7:
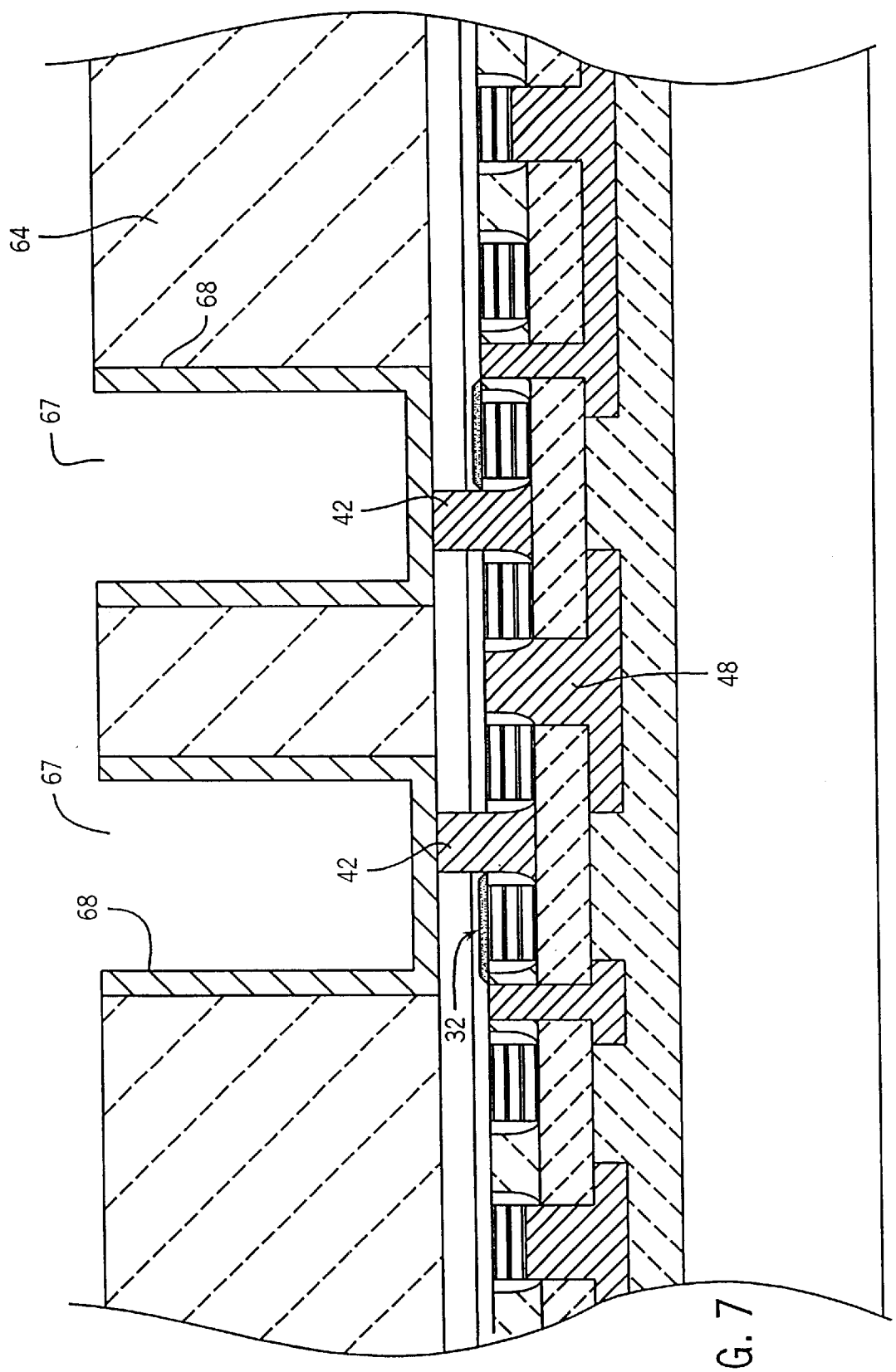
FIG. 7 is a cross sectional view of the device shown in FIG. 6 in a further stage of fabrication.

As shown in FIG. 7, a fourth insulative layer 64, e.g. BPSG, is then formed over the box oxide layer 16 and the capacitor connection plugs 42. Thereafter, the fourth insulative layer 64 is etched and capacitor openings 67 are formed down to the exposed surface of the capacitor connection plugs 42 using methods known in the art. Thereafter, capacitor 68 is formed in each of the openings 67 and is electrically connected to the source region 34 of the transistor gate stack 20 via the capacitor connection plug 42.

Several advantages of the invention are apparent from the configuration shown in FIG. 7. First of all, the capacitors 68 can be brought closer together to provide a denser semiconductor array as there is no bit line contact plug and no bit line conductor which must be sandwiched between the capacitors on the same side of the device. Instead, the bit line contact plug 48 and bit line conductor or wiring connect 58 have been formed on the opposite side of the substrate 12. In turn, the capacitors can also be made larger (taller) without having to form an equally deep contact opening or via for the bit line contact plug 48. Thus the bit line contact plug 48 may be provided in a relatively shallow contact, thereby minimizing or eliminating any self-alignment problems, as well as any "metallization" issues which would otherwise be associated with attempting to provide a good contact or plug in a deep, narrow contact opening. In other words, the method and resultant structure of the invention contemplates a relatively short bit line contact plug 48, regardless of capacitor 68 height. In addition, unlike configurations which may be already known in the art in which the capacitor is first formed on the device and the gate stacks formed thereafter, fabrication of the device according to the method of the invention helps to ensure that the self-aligned contact (SAC) etch is preserved throughout the entire fabrication process. As that term is used herein, "preserved" means that the contact plugs, as heretofore described, are not operationally degraded or destroyed and their alignment is substantially maintained. Thus, the respective contact plugs 42 and the connection plug 48 as heretofore described, e.g. doped polysilicon plugs, remain self-aligned to the their respective gate electrodes and separated therefrom by only the width of the spacer material even after the entire device is "flipped" and additional fabrication occurs, e.g. of the capacitors, thereafter. In addition, because the preferred embodiment of the invention contemplates forming the SOI structure before the electrical components are formed, any issues with forming these silicon-on-insulator layers at the end of the process are also rendered essentially moot.

A further embodiment of the invention is shown with reference starting with FIG. 8, in which a device 110 is shown representing an expanded view version of the device 10 shown in FIG. 2A. As heretofore described, the SOI substrate structure 112, 114, 116 and 118, the gate stack array 120 and attendant components are first formed as was set forth with reference to FIG. 2A.

Thereafter, as shown in FIG. 9 at least one bit line contact plug 148 is formed in a contact opening 146 in the drain region 136 of the substrate 112. The bit line contact plug 148 extends through the first insulative layer 138 and into the second silicon layer 118 and box oxide layer 116 and stops on the first silicon layer 114. Optionally, the bit line contact plug can extend into the silicon layer 114 as shown by the dotted lines in FIG. 9. Both the bit line contact opening 146 and the subsequently deposited bit line contact plug 148 are formed using the materials and methods as heretofore described for corresponding contact opening 46 and contact plug 48, respectively, as shown first in FIG. 4B. After formation, both the top of the contact plug 148 and a corresponding depth of the first insulative layer 138 in FIG. 9 are planarized, e.g. using CMP, or are etched back so as to be substantially coplanar with the tops of the transistor gate stacks 120.

Figure 10:
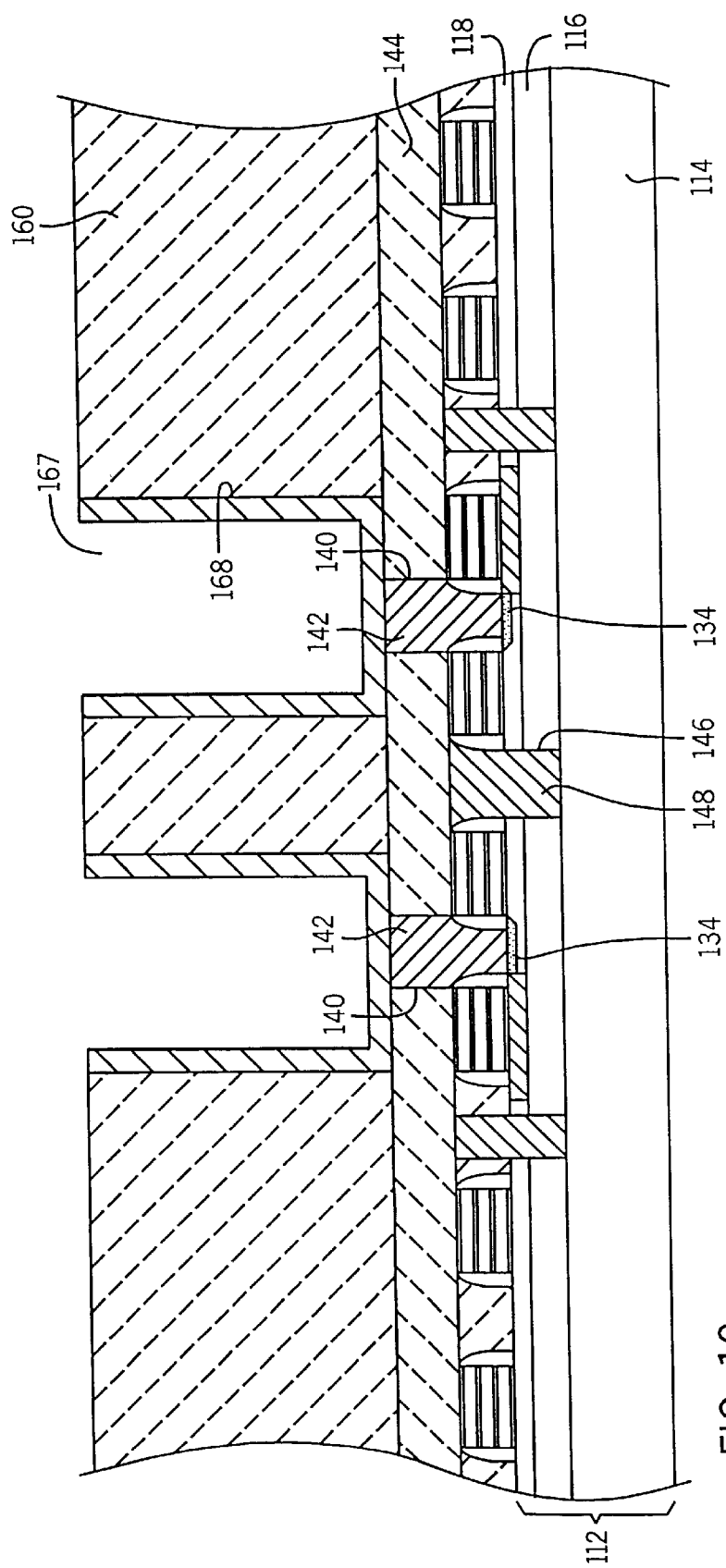
FIG. 10 is a cross sectional view of the device shown in FIG. 9 in a further stage of fabrication.

Referring now to FIG. 10, a second insulative layer 144, e.g. BPSG, is formed over the first insulative layer 138. Thereafter, at least one additional contact opening 140 is formed, preferably by self-aligned contact etching, through the second insulative layer 144 and the first insulative layer 138 and stops on the surface of the first silicon layer 118 of the substrate 112 above the surface regions 134. FIG. 10 shows a preferred embodiment with two contact openings 140.

As also shown in FIG. 10, conductive plugs or capacitor connection plugs 142 are formed in the respective contact openings 140, followed by etch back or CMP planarization so that the tops of the plugs 142 are substantially coplanar with the second insulative layer 144. A third insulative layer 160, e.g. BPSG, is then formed over the second insulative layer 144. Capacitor connection plugs 142 contact the source regions 134 in the substrate 112. Using methods and materials known in the art, capacitor openings 167 are then formed in the insulative layer 160 down to the capacitor connection plugs 142, again using materials and methods known in the art. Next, capacitors 168 are formed in the capacitor openings 167. The capacitor connection plugs 142 provide electrical connection between the capacitors 168 and the source regions 134.

Figure 11:
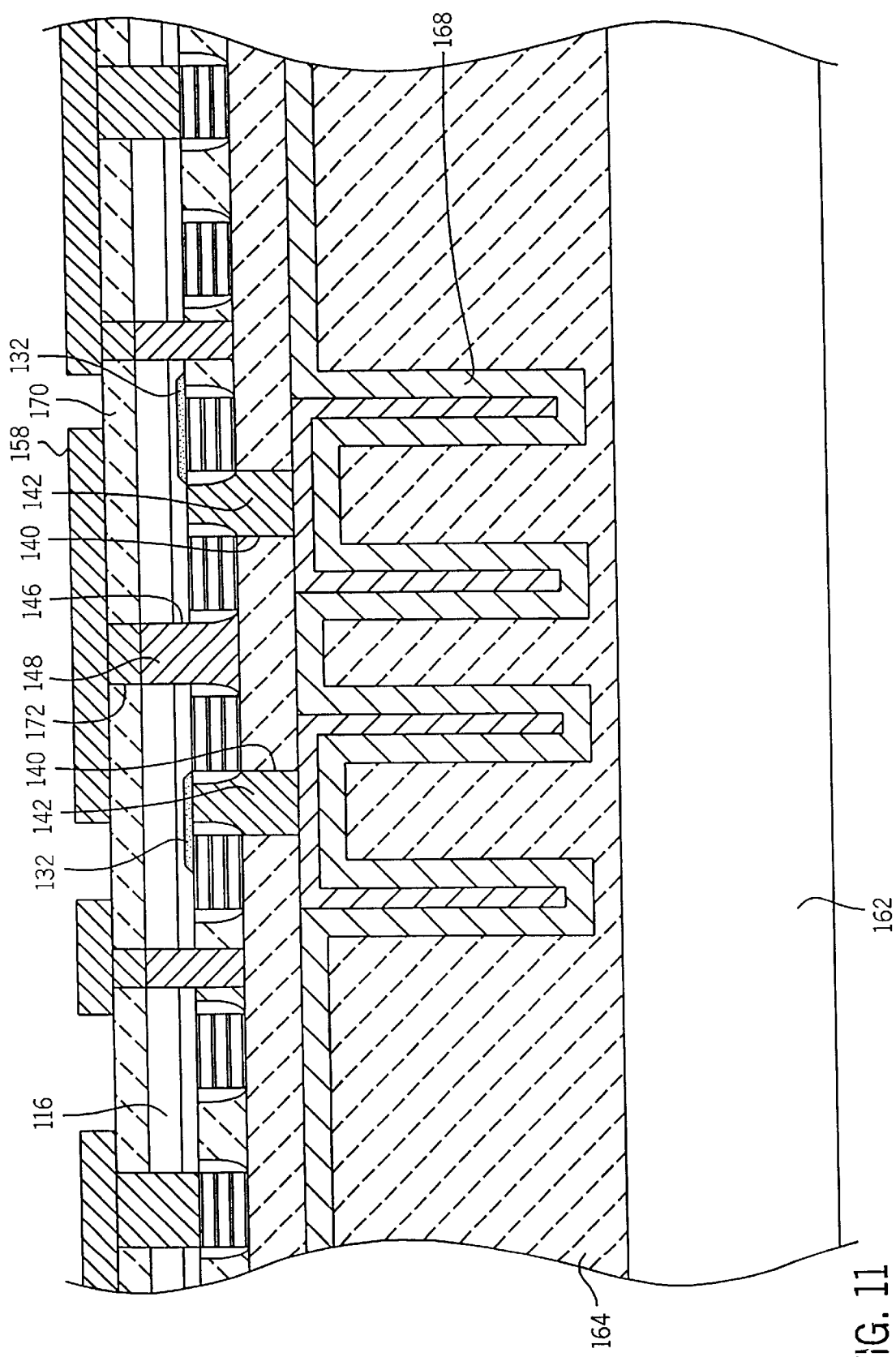
FIG. 11 is a cross sectional view of the device shown in FIG. 10 in a further stage of fabrication.

Referring now to FIG. 11, a fourth insulative layer 164, e.g. BPSG, has been formed over the third insulative layer 160 so as to "bury" the capacitors 168. A handler layer 162 is next bonded to the fourth insulative layer 164 using wafer bonding techniques as heretofore described. As shown in FIG. 11, the entire semiconductor device 110 is then turned over or "flipped", preferably approximately 180 degrees about the latitudinal axis of the substrate 112. Silicon layer 114 is then removed using etch back or CMP techniques or cleaving. An optional fifth insulative layer 170, e.g. BPSG, may be formed over the now-inverted box oxide layer 116 and covers the bit line contact plug 148. Etching is then utilized to form a contact access opening 172 over the bit line contact plug 148. A wiring connect or bit line conductor 158 is then formed in the contact access opening 172 in contact with the plug 148. The wiring connect 158 extends out of the contact access opening and across the top surface of the fifth insulative layer 170. Alternatively, the wiring connect 158 may be formed in two steps. It can be formed in the contact access opening 172 and then may be coplanarized with the top of the fifth insulative layer 170. Thereafter, formation of the wiring connect or bit line conductor 158 may be completed by further adjoining metal, e.g. tungsten, deposition which extends out of the contact access opening 172 and over the top surface of the fifth insulative layer, as is shown in FIG. 11.

Once again, the advantages associated with this embodiment of the invention should be quickly apparent to the skilled artisan. The capacitors may be brought closer together, while the bit line contact plug may be positioned on the opposite side of the substrate. Moreover, the self-aligned contacts associated with contact openings 140 and 146 and connection plugs 142 and the contact plug 148, respectively, are preserved, i.e. are not eroded or destroyed, after capacitor formation. The respective plugs thus remain separated from their respective gate stacks 120 by only the width of the spacer film 130 throughout the entire fabrication process, and upon completion thereof.

Figure 12:
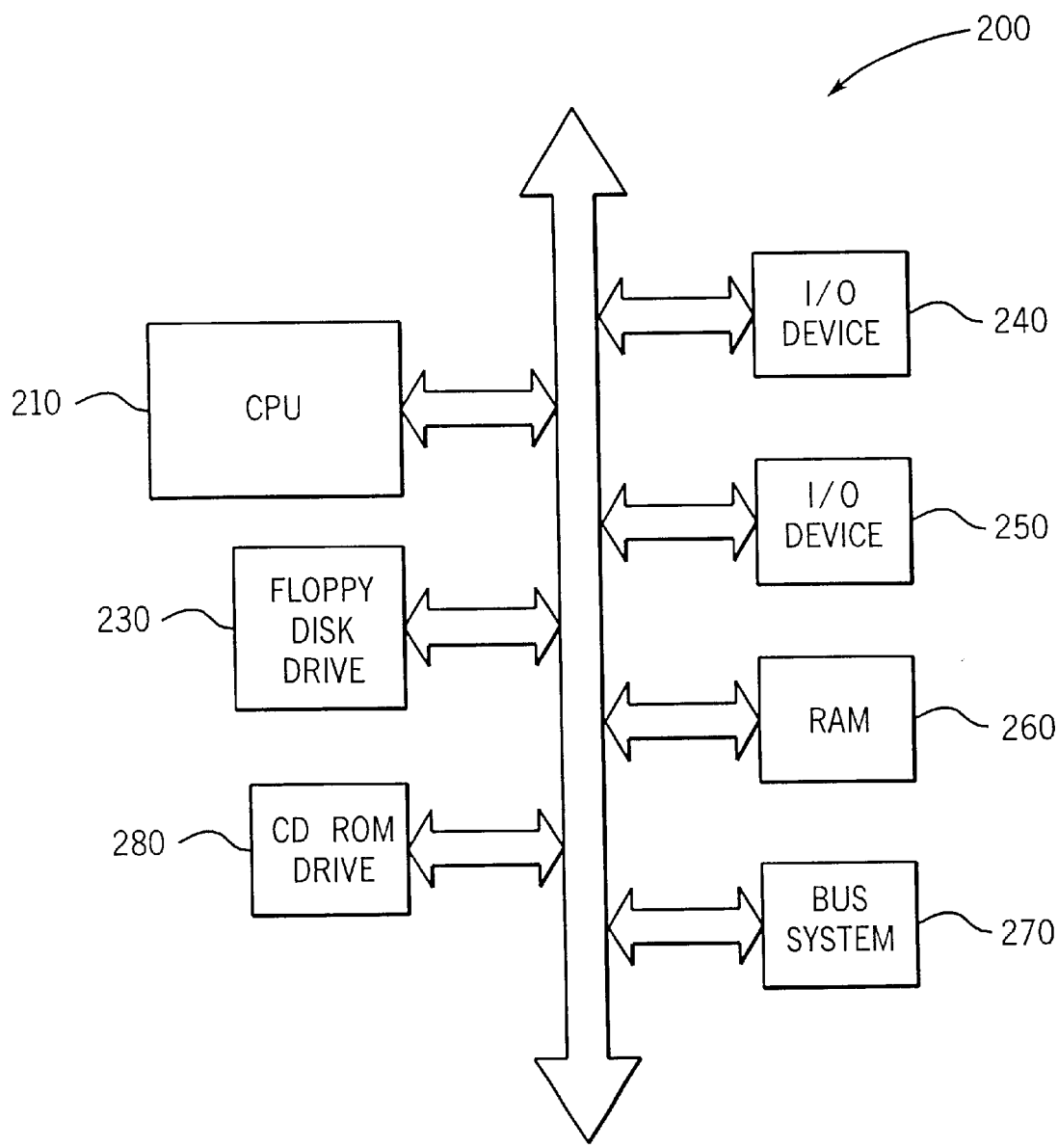
FIG. 12 is a block diagram of a typical processor based system which includes integrated circuits that utilize the devices of the present invention.

Due at least in part to their improved surface coverage, the devices herein described have wide applicability in the semiconductor industry. A typical processor based system which includes integrated circuits that utilize one or more of the devices formed in accordance with the present invention is illustrated generally at 200 in FIG. 12. A processor based system, such as a computer system, for example, generally comprises a central processing unit (CPU) 210, for example, a microprocessor, that communicates with one or more input/output (I/O) devices 240, and a hard drive 250 over a bus system 270 which may include one or more busses and/or bus bridges. The computer system 200 also includes a hard disk drive 220, a floppy disk drive 230, a random access memory (RAM) 260, a read only memory (ROM) 280 and, in the case of a computer system may include other peripheral devices such as a compact disk (CD) ROM drive 230 which also communicate with CPU 210 over the bus 270. The invention may be used in one or more of the processor, RAM and ROM, or a chip containing a processor and on board memory. While FIG. 12 shows one exemplary computer system architecture, many others are also possible.

The foregoing description is illustrative of exemplary embodiments which achieve the objects, features and advantages of the present invention. It should be apparent that many changes, modifications, substitutions may be made to the described embodiments without departing from the spirit or scope of the invention. The invention is not to be considered as limited by the foregoing description or embodiments, but is only limited by the construed scope of the appended claims.

What is claimed as new and desired to be protected by Letters Patent of the United States is:

1. A semiconductor device, comprising:

a substrate with a first and a second side, said first side being opposite said second side;

an access transistor formed on one of said first and second sides of said substrate, said access transistor comprising source and drain regions in a semiconductor material layer of said substrate and at least one gate stack including a gate region electrically connected with a word line;

at least one capacitor on said first side of said substrate and electrically connected to one of said source and drain regions;

at least one bit line conductor on said second side of said substrate and electrically connected to a different one of said source and drain regions from said capacitor; and at least one self-aligned contact plug connecting at least one of said bit line conductor and said capacitor with the respective source and drain region of said access transistor, wherein said contact plug is separated from said gate stack by a width of a spacer film overlying at least a part of said gate stack.

2. The device of claim 1, wherein said substrate is a silicon-on-insulator substrate.

3. The device of claim 1, wherein said capacitor is formed in at least one insulative layer formed on said first side of said substrate.

4. The device of claim 3, wherein said insulative layer is a BPSG layer.

5. The device of claim 1, wherein said capacitor is electrically connected to one of said source and drain regions via said contact plug, wherein said contact plug is a capacitor connection plug.

6. The device of claim 5, wherein said capacitor connection plug is formed on said second side of said substrate in a self-aligned contact opening in one of said source and drain regions.

7. The device of claim 6, wherein said capacitor connection plug is formed in an insulative layer on said second side of said substrate.

8. The device of claim 7, wherein said capacitor connection plug is formed in a contact opening in said insulative layer.

9. The device of claim 8, wherein said substrate contains at least two capacitors and further wherein at least two capacitor connection plugs have been formed on said second side of said substrate.

10. The device of claim 1, wherein said capacitor connection plug is formed of a tungsten-containing material.

11. The device of claim 1, wherein said self-aligned contact plug is a bit line contact plug and wherein said bit line conductor is electrically connected to said bit line contact plug.

12. The device of claim 11, wherein said bit line contact plug is formed through at least two insulative layers on said second side of said substrate.

13. The device of claim 12, wherein said device comprises at least two gate stacks and said bit line contact plug is formed between said two gate stacks on said substrate.

14. The device of claim 13, wherein said bit line contact plug and said bit line conductor are integrally formed.

15. The device of claim 13, wherein said bit line conductor is separately formed from said bit line contact plug.

16. The device of claim 15, wherein said bit line contact plug is planarized before said bit line conductor is formed therewith.

17. The device of claim 16, wherein said bit line conductor is formed in a self-aligned contact opening between each of said two gate stacks.

18. The device of claim 17, wherein said contact opening is preserved in said device.

19. A processor based system comprising:
    a processor; and
    an integrated circuit device coupled to said processor, at least one of said processor and integrated circuit device having a memory cell comprising:
        a substrate with a first and a second side, said first side being opposite said second side;
        an access transistor formed on one of said first and second sides of said substrate, said access transistor comprising source and drain regions in a semiconductor material layer of said substrate and at least one gate stack including a gate region electrically connected with a word line;
    at least one capacitor on said first side of said substrate and electrically connected to one of said source and drain regions;
    at least one bit line conductor on said second side of said substrate and electrically connected to a different one of said source and drain regions from said capacitor; and
    a self-aligned contact plug connecting one of said capacitor and said bit line conductor with the respective source and drain region of said access transistor.

20. The device of claim 19, wherein said substrate is a silicon-on-insulator substrate.

21. The device of claim 19, wherein said capacitor is formed in at least one insulative layer formed on said first side of said substrate.

22. The device of claim 21, wherein said insulative layer is a BPSG layer.

23. The device of claim 19, wherein said capacitor is electrically connected to one of said source and drain regions via said self-aligned contact plug, and wherein said plug is a capacitor connection plug.

24. The device of claim 23, wherein said capacitor connection plug is formed on said second side of said substrate in a contact opening in one of said source and drain regions.

25. The device of claim 24, wherein said capacitor connection plug is formed in an insulative layer on said second side of said substrate.

26. The device of claim 25, wherein said capacitor connection plug is formed in a self-aligned contact opening in said insulative layer.

27. The device of claim 26, wherein said substrate contains at least two capacitors and further wherein at least two self-aligned capacitor connection plugs have been formed on said second side of said substrate.

28. The device of claim 19, wherein said capacitor connection plug is formed of a tungsten-containing material.

29. The device of claim 19, wherein said self-aligned contact plug is a bit line contact plug which is formed through at least one insulative layer on said second side of said substrate and which is connected to said bit line conductor.

30. The device of claim 29, wherein said bit line contact plug is formed through at least two insulative layers on said second side of said substrate.

31. The device of claim 30, wherein said device comprises at least three gate stacks and said bit line contact plug is formed between a first and second gate stack, and further wherein said device comprises a second self-aligned contact plug which is a capacitor connection plug formed between a second and third gate stack.

32. The device of claim 31, wherein said bit line contact plug is integrally formed with said bit line conductor or is separately formed from said bit line conductor.

33. The device of claim 30, further comprising a fourth gate stack, wherein a third self-aligned contact plug is formed between a third and fourth gate stack.

34. The device of claim 33, wherein said bit line contact plug is planarized and said bit line conductor is formed thereover.

35. The device of claim 34, further comprising a spacer film on each of said gate stacks and wherein said self-aligned contact plugs are separated from said gate stacks by said spacer films.

36. The device of claim 35, wherein said self-aligned contacts are preserved in said device.

37. A semiconductor device, comprising:
    at least one transistor formed on a first side of a semiconductor substrate, said transistor having source and drain regions and at least one gate stack;
    at least one self-aligned bit line contact plug on said first side of said substrate and electrically connected to one of said source and drain regions;
    at least one self-aligned capacitor connection plug on a second side of said substrate and electrically connected to a different one of said source and drain regions from said bit line contact plug, said second side of said substrate being opposite said first side;
    a capacitor over and electrically connected to said capacitor connection plug;
    a wiring interconnect on said first side of said substrate and electrically coupled to said bit line contact plug.

38. The device of claim 37, wherein said substrate comprises first and second gate stacks, and said bit line contact plug is formed in a first self-aligned etched contact opening between said first and second gate stacks.

39. The device of claim 38, wherein said substrate comprises first, second and third gate stacks, and wherein said capacitor connection plug is formed in a second self-aligned contact opening between said first and second gate stacks.

40. The device of claim 39, wherein said self-aligned contact opening is etched through at least one insulative layer over said substrate.

41. The device of claim 40, wherein said memory cell comprises at least two insulative layers over said substrate and further wherein said bit line contact plug is planarized with one of said insulative layers.

42. The device of claim 41, wherein said first and second contact openings are preserved in said device.

43. A semiconductor device, comprising:
    an access transistor formed on a first side of a silicon-on-insulator substrate, said access transistor having source and drain regions in a semiconductor material layer of said substrate and at least one gate stack including a gate region electrically connected with a word line;
    a first layer of insulative material over said access transistor on said first side of said substrate;

a self-aligned capacitor connection plug in said first layer of insulative material;

a second layer of insulative material on a second side of said substrate which is opposite said first side of said substrate;

a self-aligned bit line contact plug in said second insulative layer; and a wiring interconnect integrally formed with said bit line contact plug.

44. The device of claim 43, wherein said contact openings and each of said capacitor connection plug and said bit line contact plug are preserved in said device.

45. The device of claim 44, comprising at least three gate stacks wherein each of said gate stacks has a spacer film, and said capacitor connection plug is formed between a first and second gate stack and said bit line contact plug is formed between a second and third gate stack, and wherein each of said capacitor connection plug and said bit line contact plug is separated from said respective gate stacks by said spacer film.

46. The device of claim 45, comprising at least four gate stacks wherein at least one of a second capacitor connection plug and a second bit line contact plug is formed between a third and fourth gate stack, and further wherein said second plug is separated from said gate stacks by a spacer film on each side of said gate stacks.

* * * * *